United States Patent
Xi et al.

(10) Patent No.: US 8,004,874 B2
(45) Date of Patent: Aug. 23, 2011

(54) MULTI-TERMINAL RESISTANCE DEVICE

(75) Inventors: Haiwen Xi, Prior Lake, MN (US);
Kaizhong Gao, Eden Prairie, MN (US);
Song Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 146 days.

(21) Appl. No.: 12/412,644

(22) Filed: Mar. 27, 2009

(65) Prior Publication Data

US 2010/0034011 A1     Feb. 11, 2010

Related U.S. Application Data

(60) Provisional application No. 61/086,480, filed on Aug. 6, 2008.

(51) Int. Cl.
*G11C 11/00* (2006.01)
*G11C 43/02* (2006.01)

(52) U.S. Cl. .......... 365/148; 257/43; 257/E43.001

(58) Field of Classification Search ............. None
See application file for complete search history.

(56) References Cited

U.S. PATENT DOCUMENTS

| | | | |
|---|---|---|---|
| 6,870,236 B2 * | 3/2005 | Johnson | 257/414 |
| 7,009,278 B2 * | 3/2006 | Hsu | 257/536 |
| 7,235,407 B2 | 6/2007 | Li et al. | |
| 7,259,387 B2 | 8/2007 | Kawazoe et al. | |
| 2005/0151156 A1 | 7/2005 | Wu et al. | |
| 2005/0153504 A1 | 7/2005 | Kawazoe et al. | |
| 2006/0097288 A1 | 5/2006 | Baek et al. | |
| 2007/0045694 A1 | 3/2007 | Hsu | |
| 2007/0120124 A1 | 5/2007 | Chen et al. | |
| 2007/0269683 A1 | 11/2007 | Chen et al. | |

OTHER PUBLICATIONS

Beck, A., et al., Reproducible Switching Effect in Thin Oxide Films for Memory Applications, Applied Physics Letters, Jul. 3, 2000, pp. 139-141, vol. 77, No. 1.
Chen, X., et al., Direct Resistance Profile for an Electrical Pulse Induced Resistance Change Device, Applied Physics Letters, Dec. 2, 2005, pp. 87-89, vol. 87, 233506.
Chen, X., et al., A Study of the Symmetry Properties and Multi-State Nature of Perovskite Oxide-Based Electrical Pulse Induced Resistance-Change Devices, New Journal of Physics, Oct. 9, 2006, pp. 1-13, vol. 8, 229.
Rozenberg, M.J., Nonvolatile Memory with Multilevel Switching: A Basic Model, Physical Review Letters, Apr. 30, 2004, pp. 1-4, vol. 92, No. 17.
Tokura, Yoshinori, Correlated-Electron Physics in Transition-Metal Oxides, Physics Today, Jul. 2003, pp. 51-55.

* cited by examiner

*Primary Examiner* — Hoai V Ho
*Assistant Examiner* — James G Norman
(74) *Attorney, Agent, or Firm* — Fredrikson & Byron, PA

(57) ABSTRACT

Embodiments of the invention provide a multi-terminal resistance device with first and second electrodes, a shared third electrode, and a resistance layer providing first and second current paths between the shared third electrode and the first and second electrodes, respectively. A current state of the device may be programmed by applying one or more electrical signals along the first and/or second current paths to change a resistance of the device. In some embodiments, applying an electrical signal may switch a junction resistance of the first and/or second electrodes and the resistance layer between two or more resistance values. The device may include a shared fourth electrode to provide extra programming capability. In some embodiments, the device may be used to store a data state, to determine a count of multiple electrical signals, or to perform a logic operation between two electrical signals.

21 Claims, 4 Drawing Sheets

US 8,004,874 B2

MULTI-TERMINAL RESISTANCE DEVICE

CROSS-REFERENCES

This application claims priority to U.S. Provisional Patent Application Ser. No. 61/086,480, filed Aug. 6, 2008, the content of which is herein incorporated by reference in its entirety.

BACKGROUND

In recent years, the memory market has gradually shifted from being PC (personal computer) driven to being consumer device driven. Accordingly, memory with high density and speed, low power consumption, small form factor, and inexpensive data storage has been in high demand.

Memory can either be classified as volatile or non-volatile. Volatile memory is memory that loses its contents when the power is turned off. In contrast, non-volatile memory does not require a continuous power supply to retain information. As such, non-volatile memory devices are widely employed in computers, mobile communications terminals, memory cards, and the like. Many non-volatile memories use solid-state memory devices as memory elements. In some cases, nonvolatile memory devices have employed flash memory. In recent years, non-volatile memory devices designs have employed resistance random access memory (RRAM). A unit cell of RRAM usually includes a data storage element which has a variable resistive material layer. Generally, the resistance of the variable resistive layer can be changed with an electrical pulse to write data to the unit cell of RRAM.

Given the general desire to quickly store and retrieve ever-increasing amounts of digital information, designers and manufacturers of memory devices are continually striving to increase the memory cell density of storage media to store greater amounts of information in smaller areas. Accordingly, there is a need for improvements in memory design to decrease memory cell size and thus increase memory cell densities.

SUMMARY

According to one aspect of the invention, an exemplary multi-terminal resistance device is provided including at least a first and a second electrode, with a resistance layer electrically coupled to the first and second electrodes. A shared third electrode is also electrically coupled to the resistance layer. The resistance layer provides a first current path between the shared third electrode and the first electrode and a second current path between the shared third electrode and the second electrode.

These and various other features and advantages will be apparent from a reading of the following detailed description.

DETAILED DESCRIPTION OF THE PREFERRED EMBODIMENTS

Figure 1A:
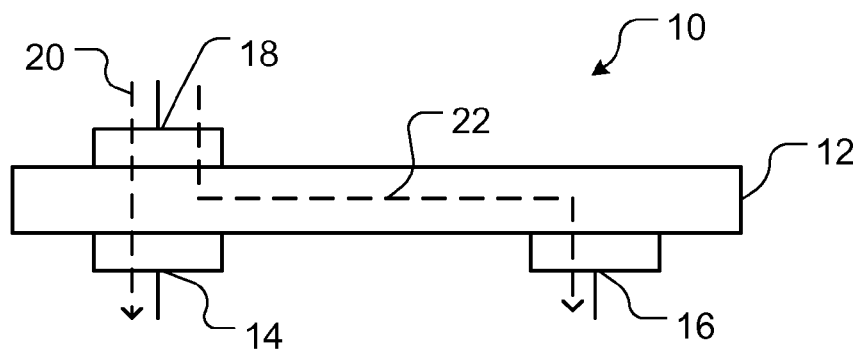
FIG. 1A is a cross-section of a multi-terminal resistance device according to one aspect of the present invention.

The following detailed description should be read with reference to the drawings, in which like elements in different drawings are numbered identically. It will be understood that embodiments shown in the drawings and described herein are merely for illustrative purposes and are not intended to limit the invention to any embodiment. On the contrary, it is intended to cover alternatives, modifications, and equivalents as may be included within the scope of the invention as defined by the appended claims.

FIG. 1A is a cross-section of a multi-terminal resistance device 10 in accordance with certain embodiments. The resistance device 10 generally includes a resistance layer 12 that is electrically coupled to multiple electrodes. According to one embodiment, the resistance layer 12 is formed from a variable resistive material that, for example, exhibits an electrical pulse induced resistance (EPIR) effect. As such, the resistance device 10 can be induced into one or more states and is useful for storing information and performing other operations based on the electrical signals it receives.

In some embodiments the resistance device 10 is configured as a unit memory cell, such as in an RRAM array. The exemplary resistance device 10 shown in FIG. 1A provides an improved resistance device that provides a number of advantages over conventional RRAM cells. In one embodiment, for example, the resistance device 10 includes one or more shared electrodes that allow storage of multiple bits of information within a single unit cell. Other advantages and novelties will become apparent throughout the course of this disclosure.

Returning to FIG. 1A, in accordance with the depicted embodiment, the resistance layer 12 is electrically coupled to a first electrode 14, a second electrode 16, and a shared third electrode 18. The third electrode 18 is "shared" in the sense that it is electrically coupled through the resistance layer 12 to both the first and second electrodes 14, 16. For example, in some embodiments a potential applied between the shared third electrode 18 and the first and second electrodes 14, 16 induces the resistance layer 12 to provide a first current path 20 between the shared third electrode 18 and the first electrode 14, and a second current path 22 between the shared third electrode 18 and the second electrode 16, respectively.

In some embodiments, the shared third electrode 18 can be used as a shared write electrode to program the resistance device 10 using either or both of the first and/or second electrodes 14, 16. For example, in one case, applying a current along the first current path 20 induces a first resistance change in the device 10, while applying a current along the second current path 22 induces a second, separate resistance change in the device 10. Among other advantages, associating data states with the first and/or second resistance changes allows the device 10 to provide multi-bit capabilities within a single memory cell with less dedicated terminals than in conventional memory cells.

Figure 1B:
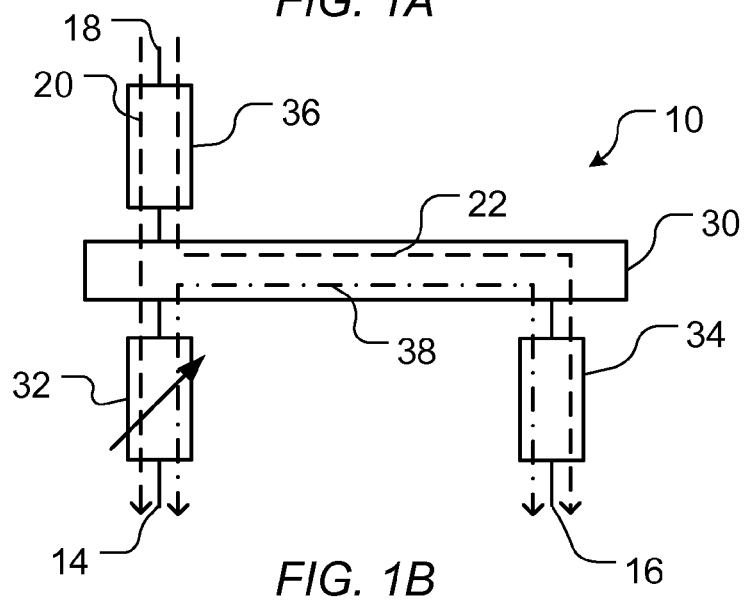
FIG. 1B is a schematic of one embodiment of the multi-terminal resistance device of FIG. 1A.

FIG. 1B is a high level schematic of the multi-terminal resistance device 10 according to one embodiment of the invention. A media film resistance $R_M$ 30 represents the resistance of the resistance layer 12 shown in FIG. 1A. While the media film resistance 30 may change somewhat during operation of the device 10, the majority of resistance change induced in the device by an electrical signal takes place at the interface of the resistance layer 12 and the first, second, and third electrodes 14, 16, 18, rather than within $R_M$ 30 itself. Accordingly, the resistances between the electrodes and the resistance layer 12 are modeled as a first junction resistance $R_{J1}$ 32 proximate the first electrode 14, a second junction resistance $R_{J2}$ 34 proximate the second electrode 16, and a third junction resistance $R_{J3}$ 36 proximate the third electrode 18.

According to one embodiment, $R_{J1}$ 32 is a variable resistance that is switchable between a first resistance value and a second resistance value according to an electrical signal applied between the first electrode 14 and the shared third electrode 18 along the first current path 20. For example, a first electrical signal (e.g., current or voltage) having a magnitude and a polarity may be applied to the first current path 20 to induce the first junction resistance 32 into a high resistance state. Another electrical signal having the same magnitude and opposite polarity may be applied to the first current path 20 to induce the first junction resistance 32 into a low resistance state. Thus, by assigning data states to the first and second resistance values, the first junction resistance 32 can be programmed to switch between and hold a state of the resistance device 10.

In some embodiments, for example, the junction resistance may switch between a low state having a resistance of about 1 Kohms and a high state having a resistance of about 1 Mohms. The programming voltage may in some cases be +/−3 Volts or lower, depending upon the specific materials making up the electrodes and resistance layers. Of course, other signal strengths and resistance levels may be used according to different embodiments of the invention.

With continued reference to FIG. 1B, the current state of the resistance device 10 can be determined by measuring the value of the first junction resistance 32. In one embodiment, the first and second electrodes 14, 16 act as read terminals to allow recovery of the device state. For example, upon applying a potential across the first and second electrodes 14, 16, the resistance layer 12 provides a third current path 38 between the first and second electrodes 14, 16. This third current path 38 has a resistance $R_{3C}$ including the first junction resistance 32, the media film resistance 30, and the second junction resistance 34. By measuring the resistance $R_{3C}$ of the third current path 38, $R_{J1}$ 32 can be determined given the other resistances are known. The media film resistance 30 is typically a few Kohms, although it may vary depending upon the geometry of the device, such as the length, width, and thickness. Upon determining $R_{J1}$ 32, the current state of the resistance device 10 can also be determined.

Accordingly, depending upon the value of $R_{J1}$, the resistance $R_{3C}$ may comprise one of a plurality of resistance values, each corresponding to a different data state. In some embodiments where the first junction resistance 32 only switches between a first and a second resistance value, the current state of the resistance device 10 may only be one of two possible data states.

Figure 1C:
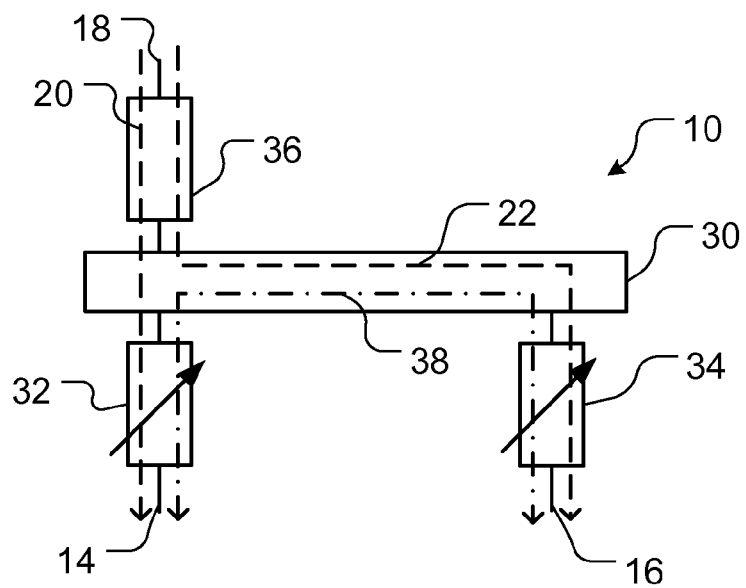
FIG. 1C is a schematic of one embodiment of the multi-terminal resistance device of FIG. 1A.

Referring now to FIG. 1C, in some embodiments, the second junction resistance 34 is configured as a variable resistance. Similar to the description above, an electrical signal may be applied to the second current path 22 to induce the second junction resistance 34 into a high or low resistance state. By assigning data states to the first and second resistance values, the second junction resistance 32 can be programmed to switch between and hold a state of the resistance device 10. The current state of the device may again be determined by measuring the resistance of the third current path $R_{3C}$ to determine the second junction resistance 34.

In an additional embodiment, multi-bit operations are provided by configuring both the first and the second junction resistances 32, 34 as variable resistances as outlined above. In such a case, the first and second junction resistances 32, 34 may be individually programmed, thus providing four possible resistance values and data states for the resistance device 10. Accordingly, the resistance device 10 may advantageously function as a multi-bit RRAM cell while having one less electrode or terminal than the two RRAM cells required to provide multi-bit functionality in a conventional RRAM array.

Because the resistance device 10 makes multi-bit operations possible with a single resistance layer 12 and less than the conventional number of electrodes, more information can be stored within a smaller area than in conventional applications. For example, multiple instances of the resistance device 10 may be combined to form an RRAM array having only one write line for every two read lines within the array. As will be appreciated, this can provide valuable space and material savings, leading to a denser and less expensive memory array.

Further, in some embodiments, one or more of the first and second junction resistances 32, 34 may be switchable between more than two resistance values. For example, in one embodiment applying different signal magnitudes (e.g., greater and lesser voltages) or signal durations changes a junction resistance between more than two resistance values. In another embodiment, multiple identical signal pulses switches a junction resistance between multiple resistance values. Thus, each of the first and second junction resistances 32, 34 may potentially be configurable into more than two states, thus providing a resistance device 10 capable of storing greater than two bits of data.

Figure 2A:
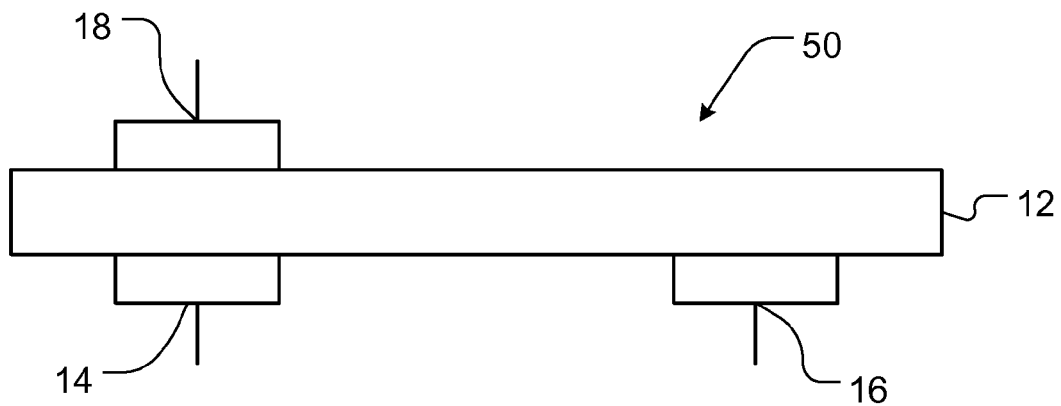
FIG. 2A is a cross-section of a multi-terminal resistance device according to one aspect of the present invention.
Figure 2B:
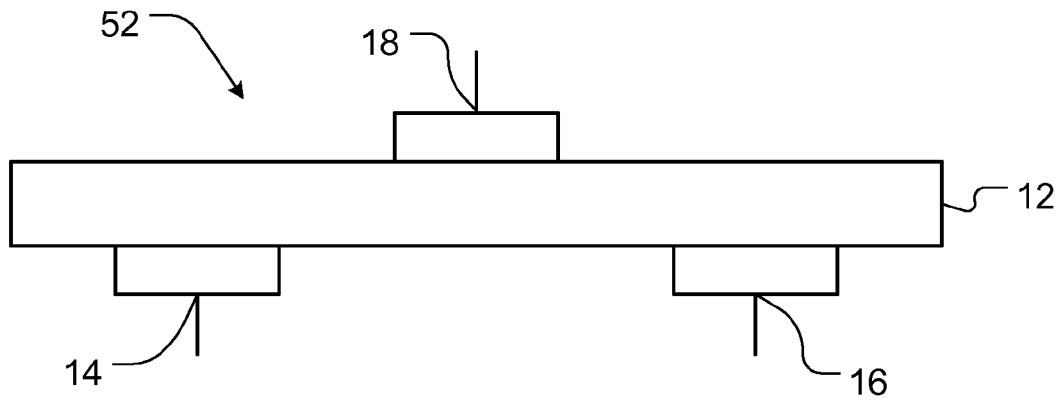
FIG. 2B is a cross-section of a multi-terminal resistance device according to one aspect of the present invention.
Figure 2C:
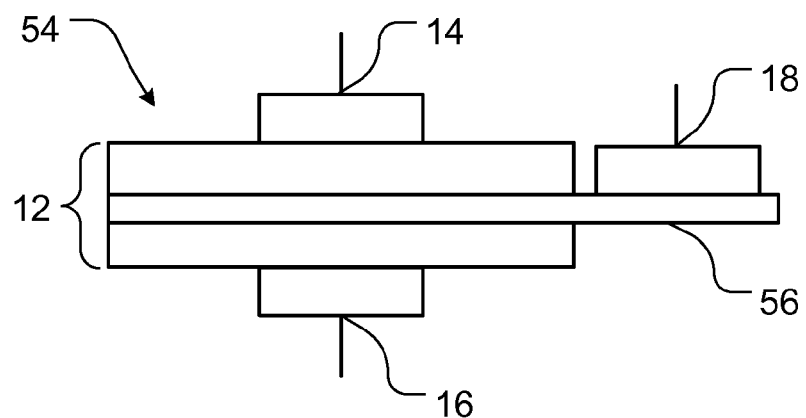
FIG. 2C is a cross-section of a multi-terminal resistance device according to one aspect of the present invention.

Turning now to FIGS. 2A-2C, multiple physical configurations 50, 52, 54 of a multi-terminal resistance device are depicted in cross-section according to certain embodiments. As is shown, a multi-terminal resistance device may take on a variety of physical configurations and layouts depending upon the specific requirements for a particular design. FIG. 2A depicts an asymmetric configuration of the electrodes 14, 16, 18, while FIG. 2B shows a symmetric configuration. Referring to FIG. 2C, in one embodiment, a conductive element 56 may be inserted into a middle of the resistance layer 12 in order to provide a common connection for the shared third electrode 18. FIGS. 2A-2C merely represent three possible configurations of a three-terminal resistance device and do not represent an exhaustive list of configurations nor are they meant to limit the invention to any one configuration.

The resistance layer 12 may comprise any material having the desired resistance switching capability. For example, in some embodiments, the resistance layer 12 may be formed form one or more materials exhibiting an EPIR effect. In certain embodiments, the resistance layer 12 maybe formed of a binary transition metal oxide, such as one selected from the group consisting of $CuO$, $NiO$, $CoO$, $ZnO$, $CrO_2$, $TiO_2$, $HfO_2$, $ZrO_2$, $Fe_2O_3$, and $Nb_2O_5$. In other cases the resistance layer 12 may include a perovskite colossal magnetoresistive material or a ferroelectric material such as $Pr_{0.7}Ca_{0.3}MnO_3$, $YBa_2Cu_3O_7$, $SrTiO_3$, or PZT.

In some cases the first, second, and third electrodes 14, 16, 18 are formed of the same material, although this is not necessary. For example, one or more of the electrodes may be formed from materials selected from the group consisting of Pt, Ag, Au, Ru and SrRuO$_3$. In some preferred embodiments, the first electrode 14 comprises a different material than the second electrode 16 in order to provide slightly different resistance characteristics. For example, when the first junction resistance 32 and the second junction resistance 34 each take on different high and low resistance values, it may be possible to clearly identify the current state of the device based on the overall resistance measurement between the first and second electrodes.

Figure 3A:
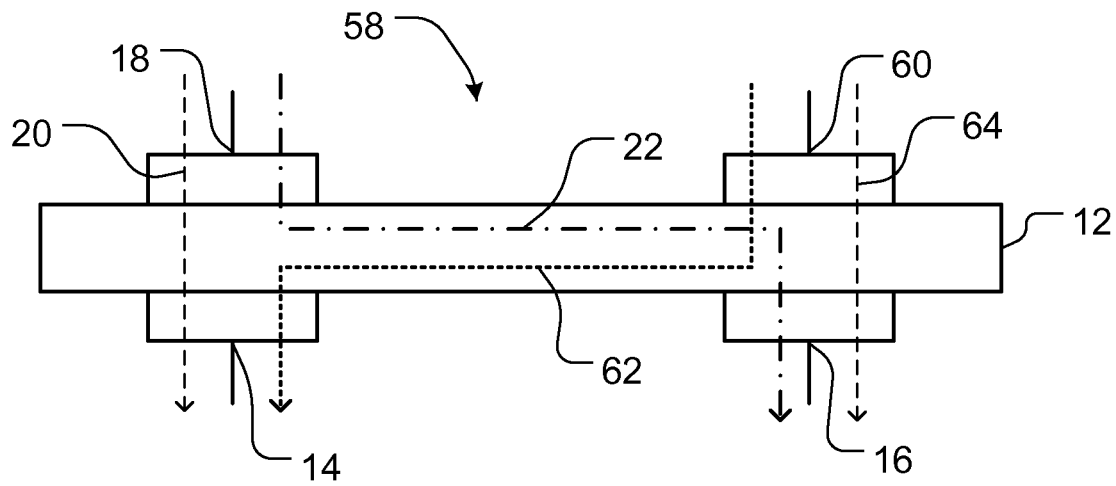
FIG. 3A is a cross-section of a multi-terminal resistance device according to one aspect of the present invention.
Figure 3B:
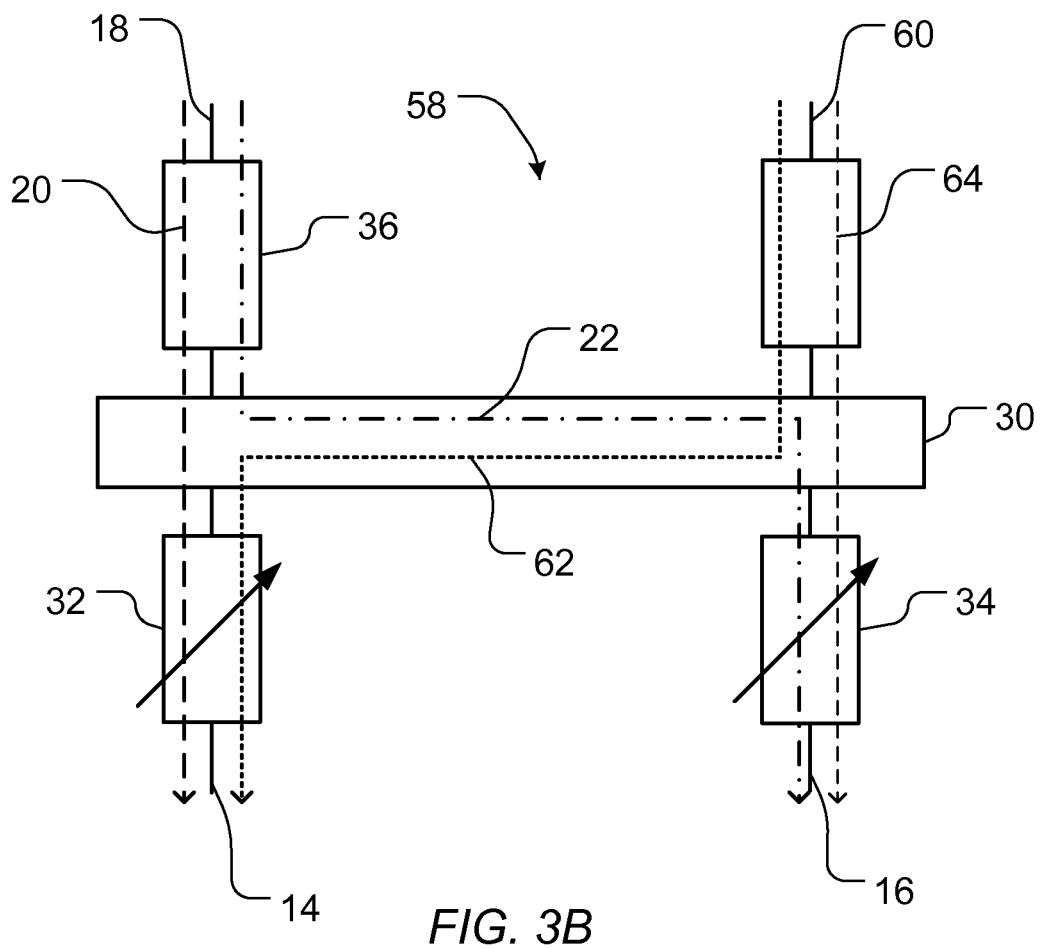
FIG. 3B is a schematic of one embodiment of the multi-terminal resistance device of FIG. 3A.

With reference now to FIGS. 3A and 3B, in some embodiments of the invention, a resistance device 58 is provided with a shared fourth electrode 60 electrically coupled with the resistance layer to provide a second and/or independent method of writing to the first and second electrodes 32, 34 apart from the shared third electrode 18. The fourth electrode 60 is "shared" in the sense that it is electrically coupled through the resistance layer 12 to both the first and second electrodes 14, 16. For example, in some embodiments a potential applied to the shared fourth electrode 60 induces the resistance layer 12 to provide a fourth current path 62 between the shared fourth electrode 60 and the first electrode 14, and a fifth current path 64 between the shared fourth electrode 60 and the second electrode 16. Thus in some embodiments, the shared fourth electrode 18 may act as a shared write electrode or terminal, which may be used to program the resistance device 58 using the first and/or second electrodes 14, 16.

Accordingly, in one embodiment, an electrical signal may be applied to the first current path 20 and/or the fourth current path 62 in order to switch the first junction resistance 32. Similarly, an electrical signal may be applied to the second current path 22 and/or the fifth current path 64 in order to switch the second junction resistance 34. Thus, this four terminal resistance device 58 provides two degrees of freedom for switching the first and/or second junction resistances 32, 34. Accordingly, in some embodiments, the resistance device 58 may function as a switch with two independent controls in the shared third and fourth electrodes. In addition, the dual shared electrodes can allow parallel data processing according to some embodiments.

In certain embodiments, the resistance device 58 shown in FIG. 3A may advantageously function as a logic element with inputs at the shared third and fourth electrodes 18, 60, and the output measured across the first and second electrodes 14, 16. For example, a first electrical signal may be applied along the first current path 20 and a second electrical signal may be applied along the fifth current path 64 to set the current state of the resistance device 58. The current state may then be reflected as the sum of the first junction resistance 32, the second junction resistance 34 and the media resistance 30. In an embodiment where each junction resistance 32, 34 may take on two possible values, the four possible resistance values for the resistance sum may then be assigned states reflecting a logic operation between the first electrical signal and the second electrical signal. For example, the assigned states may reflect an AND operation or an OR operation.

As previously mentioned, in some embodiments of the invention, multiple signal pulses are used to switch a junction resistance between two or more resistance values and data states, thus providing added flexibility and functionality for a resistive device. For example, returning to FIG. 1B, in some cases the value of junction resistance 32 may change with each additional signal pulse applied between the first electrode 14 and the third electrode 18. Thus, in some embodiments, the value of the junction resistance 32 informs as to the number of pulses that have been previously applied between the first and third electrodes 14, 18. Accordingly, by measuring the junction resistance 32 (e.g., as part of the overall resistance along the third current path 38), the resistive device can be used to count signal pulses and/or convert a discrete number of signal pulses (i.e., digital information) into a single resistance value (i.e., analog information).

Figure 4A:
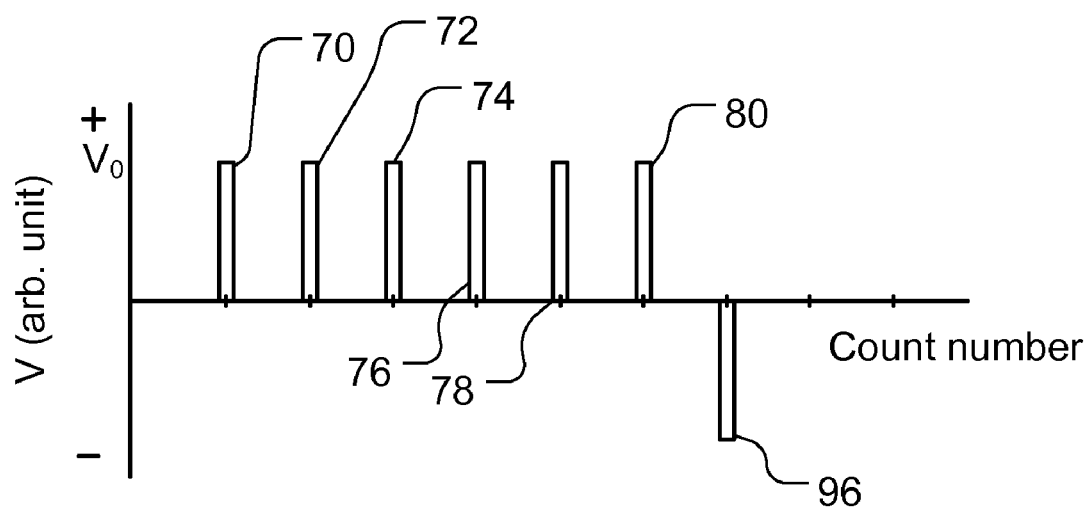
FIG. 4A is a graphical representation of multiple signals received by a multi-terminal resistance device over time according to one aspect of the present invention.
Figure 4B:
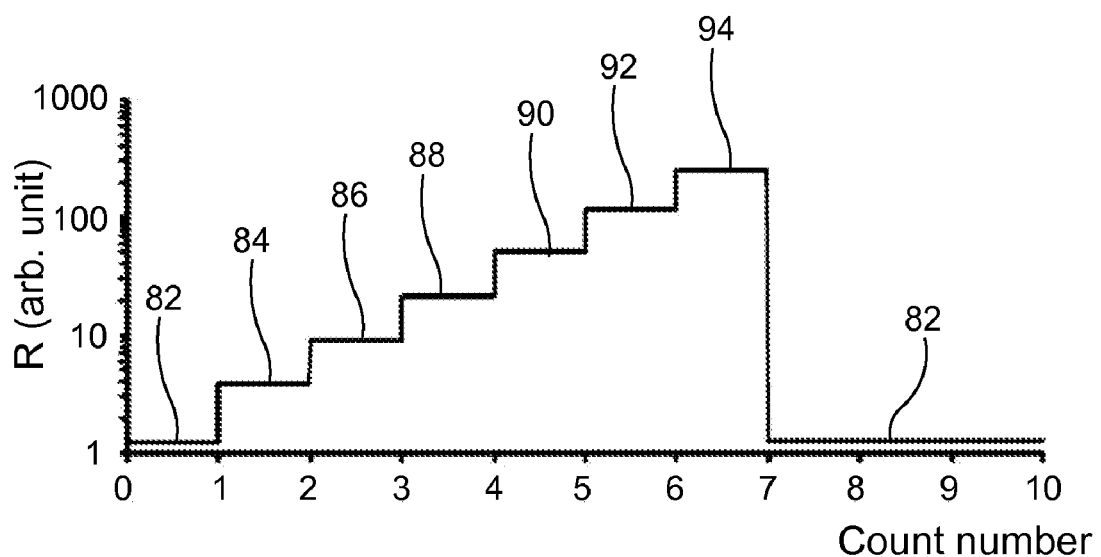
FIG. 4B is a graphical representation of a resistance change in a multi-terminal resistance device corresponding the signals shown in FIG. 4A.

FIGS. 4A and 4B illustrate the operation of a resistive device (e.g., any of the resistive devices described above) as a number counter or digital to analog converter according to some embodiments of the invention. FIG. 4A illustrates a group of signal pulses 70, 72, 74, 76, 78, and 80 applied across a junction resistance (e.g., junction resistance 32 in FIG. 1B) having a magnitude of V$_0$ volts. In some embodiments, the junction resistance switches between a series of resistance values as each consecutive signal pulse is applied across the junction.

For example, referring to FIG. 4B, in some cases, the junction resistance may increase a predefined amount with each additional signal pulse. The junction resistance may be initially set to a low resistance value 82. The first voltage pulse 70 changes the junction resistance to a first resistance value 84. The second positive pulse 72 then changes the junction resistance to a second resistance value 86. Likewise, each additional signal pulse 74, 76, 78, and 80, changes the junction resistance to increasing resistance values 88, 90, 92, and 94, respectively. In some embodiments, an opposite signal pulse 96 resets the junction resistance to the low resistance value 82. In other cases, a voltage pulse with the same polarity but with a different level may be used to reset to the low resistance value 82.

As shown in FIG. 4B, the consecutive resistance levels for different numbers of signal pulses may be well separated in value and repeatable and recoverable. Thus, the total number of signal pulses at any given time can be determined by measuring the junction resistance. Multiple data bits may be stored by defining, for instance, a bit of "000" as the low resistance level 82, and bits "001", "010", "011", "100", etc., can then be respectively defined as the resistance values 84, 86, 88, 90 and so on. In some embodiments, the signal pulse 96 resets the junction resistance to the low resistance state "000".

Thus, differing numbers of signal pulses can be stored as multiple bits of data, counted, and/or converted to an analog value by a single junction resistance in a resistive device. In some embodiments, only a single junction resistance may be programmed in this way (e.g., junction resistance 32 in FIG. 1B), while in other embodiments multiple junction resistances may be programmed in this way to provide even greater functionality. For example, both junction resistances 32 and 34 in FIG. 1C may store a count. The state of the resistive device can be determined by measuring the resistance between the first and second electrodes 32, 34, which includes the first and second junction resistances 32, 34.

Thus, embodiments of the MULTI-TERMINAL RESISTANCE DEVICE are disclosed. Although the present invention has been described in considerable detail with reference to certain disclosed embodiments, the disclosed embodiments are presented for purposes of illustration and not limitation and other embodiments of the invention are possible. One skilled in the art will appreciate that various changes, adaptations, and modifications may be made without departing from the spirit of the invention and the scope of the appended claims.

What is claimed is:

1. A multi-terminal resistance device, comprising:
   a first electrode;
   a second electrode;
   a resistance layer electrically coupled to the first and second electrodes; and
   a shared third electrode electrically coupled to the resistance layer, wherein the resistance layer provides a first current path between the shared third electrode and the first electrode, a second current path between the shared third electrode and the second electrode, and a third current path between the first and second electrodes, the third current path having a resistance defining a current state of the resistance device, wherein the resistance of the third current path is switchable between at least three resistance values to provide switching of the current state between at least three data states respectively corresponding to the at least three resistance values.

2. The resistance device of claim 1, wherein the resistance of the third current path includes a first junction resistance proximate the first electrode.

3. The resistance device of claim 2, wherein the resistance of the third current path includes a second junction resistance proximate the second electrode.

4. A multi-terminal resistance device, comprising:
   a first electrode;
   a second electrode;
   a resistance layer electrically coupled to the first and second electrodes; and
   a shared third electrode electrically coupled to the resistance layer,
   wherein the resistance layer provides a first current path between the shared third electrode and the first electrode, a second current path between the shared third electrode and the second electrode, and a third current path between the first and second electrodes, the third current path having a resistance defining a current state of the resistance device,
   wherein the resistance of the third current path includes a first junction resistance proximate the first electrode and a second junction resistance proximate the second electrode, and
   wherein at least one of the first and second junction resistances is a variable resistance switchable between a first resistance value and a second resistance value.

5. The resistance device of claim 4, wherein at least one of the first and second junction resistances is switchable between more than two resistance values.

6. The resistance device of claim 1, further comprising a shared fourth electrode electrically coupled to the resistance layer, wherein the resistance layer provides a fourth current path between the shared fourth electrode and the first electrode and a fifth current path between the shared fourth electrode and the second electrode.

7. A multi-terminal resistance device, comprising:
   a first electrode;
   a second electrode;
   a resistance layer electrically coupled to the first and second electrodes;
   a shared third electrode electrically coupled to the resistance layer, and
   a shared fourth electrode electrically coupled to the resistance layer,
   wherein the resistance layer provides a first current path between the shared third electrode and the first electrode, a second current path between the shared third electrode and the second electrode, a third current path between the first and second electrodes, the third current path having a resistance defining a current state of the resistance device, a fourth current path between the shared fourth electrode and the first electrode, and a fifth current path between the shared fourth electrode and the second electrode,
   wherein the resistance of the third current path comprises a first variable resistance proximate the first electrode, the first variable resistance being switchable between a plurality of resistance values based on a first current flow along one or more of the first and fourth current paths.

8. The resistance device of claim 7, wherein the resistance of the third current path comprises a second variable resistance proximate the second electrode, the second variable resistance being switchable between a plurality of resistance values based on a second current flow along one or more of the second and fifth current paths.

9. The resistance device of claim 1 wherein the first, second, and third electrodes are formed of materials selected from the group consisting of Pt, Ag, Au, Ru and $SrRuO_3$.

10. The resistance device of claim 1, wherein the resistance layer is formed of a material exhibiting an electrical pulse induced resistance effect.

11. The resistance device of claim 10, wherein the resistance layer is formed of a binary transition metal oxide selected from the group consisting of $CuO$, $NiO$, $CoO$, $ZnO$, $CrO_2$, $TiO_2$, $HfO_2$, $ZrO_2$, $Fe_2O_3$, and $Nb_2O_5$.

12. The resistance device of claim 10, wherein the resistance layer is formed of a complex oxide from the group consisting of perovskite colossal magnetoresistive materials and ferroelectric materials.

13. A method for operating a resistance device, comprising:
   providing a resistance device having a first electrode, a second electrode, a resistance layer electrically coupled to the first and second electrodes, and a shared third electrode electrically coupled to the resistance layer, the resistance layer providing a first current path from the shared third electrode to the first electrode, a second current path from the shared third electrode to the second electrode, and a third current path between the first and second electrodes, the third current path having a resistance defining a current state of the resistance device;
   applying a first electrical signal along the first current path to set the current state of the resistance device; and
   determining the current state of the resistance device by measuring the resistance of the third current path.

14. The method of claim 13, further comprising applying a second electrical signal along the second current path to set the current state of the resistance device.

15. The method of claim 14, wherein the resistance of the third current path is switchable between at least three resistance values to provide switching of the current state between at least three data states respectively corresponding to the at least three resistance values.

16. The method of claim 13, further comprising applying multiple electrical signals along the first and/or second current paths to change the resistance between the first and second electrodes, and further comprising measuring the resistance to determine a count of the multiple electrical signals.

17. A method for operating a resistance device, comprising:
   providing a resistance device having a first electrode, a second electrode, a resistance layer electrically coupled to the first and second electrodes, and a shared third electrode electrically coupled to the resistance layer, the resistance layer providing a first current path from the shared third electrode to the first electrode and a second current path from the shared third electrode to the second electrode;

applying a first electrical signal along the first current path to set a current state of the resistance device;

measuring the resistance between the first and second electrodes to determine the current state of the resistance device; and providing the resistance device with a shared fourth electrode electrically coupled to the resistance layer, the resistance layer providing a fourth current path between the shared fourth electrode and the first electrode and a fifth current path between the shared fourth electrode and the second electrode, applying a second electrical signal along the fifth current path to set the current state of the resistance device, the current state reflecting a logic operation between the first electrical signal and the second electrical signal.

18. The resistance device of claim 1, wherein the resistance of the third current path is switchable between five or more resistance values to provide switching of the current state between five or more data states respectively corresponding to the five or more resistance values.

19. The resistance device of claim 1, wherein the first electrode comprises a different material than the second electrode.

20. The resistance device of claim 3, wherein the first junction resistance is switchable between a first set of resistance values and the second junction resistance is switchable between a second set of resistance values different than the first set of resistance values.

21. The method of claim 13, wherein the first electrode comprises a different material than the second electrode.

* * * * *